United States Patent
Hori et al.

(10) Patent No.: US 7,555,058 B2
(45) Date of Patent: Jun. 30, 2009

(54) DELAY LOCKED LOOP CIRCUIT, DIGITAL PREDISTORTION TYPE TRANSMITTER USING SAME, AND WIRELESS BASE STATION

(75) Inventors: Kazuyuki Hori, Tokyo (JP); May Suzuki, Koganei (JP)

(73) Assignee: Hitachi Communication Technologies, Ltd., Tokyo (JP)

( * ) Notice: Subject to any disclaimer, the term of this patent is extended or adjusted under 35 U.S.C. 154(b) by 395 days.

(21) Appl. No.: 11/030,060

(22) Filed: Jan. 7, 2005

(65) Prior Publication Data
US 2006/0056536 A1    Mar. 16, 2006

(30) Foreign Application Priority Data
Sep. 10, 2004    (JP)    ............... 2004-263195

(51) Int. Cl.
    H04L 25/03    (2006.01)
(52) U.S. Cl. ................... 375/296; 455/114.3
(58) Field of Classification Search ............ 375/296, 375/297
    See application file for complete search history.

(56) References Cited

U.S. PATENT DOCUMENTS

| | | | |
|---|---|---|---|
| 6,570,444 B2 * | 5/2003 | Wright | 330/149 |
| 6,836,517 B2 * | 12/2004 | Nagatani et al. | 375/296 |
| 7,106,133 B2 * | 9/2006 | Hamada et al. | 330/149 |
| 2003/0231716 A1 * | 12/2003 | Unger | 375/296 |

FOREIGN PATENT DOCUMENTS

| | | |
|---|---|---|
| JP | 2001-189685 | 7/2001 |
| JP | 2003-174332 | 6/2003 |
| JP | 2003-273663 | 9/2003 |

\* cited by examiner

Primary Examiner—David C Payne
Assistant Examiner—Leon Flores
(74) Attorney, Agent, or Firm—Antonelli, Terry, Stout & Kraus, LLP.

(57) ABSTRACT

Disclosed are a delay locked loop circuit capable of accurately extracting nonlinear distortion superimposed on an output of a digital predistortion type transmitter, the digital predistortion type transmitter, and a wireless base station using the same. The delay locked loop circuit outputting a smoothed signal to the variable delay element, in which delay control is implemented for checking distortion occurring to the output IQ signals due to the same passing through the analog circuit by means of the variable delay element. Either the first input IQ signals or the second input IQ signals are signals generated as a result of output IQ signals Io, Qo undergoing digital-to-analog conversion, and again undergoing analog-to-digital conversion after passing through an analog circuit. In particular, an IIR filter may be used for the variable delay element.

24 Claims, 9 Drawing Sheets

DELAY LOCKED LOOP CIRCUIT, DIGITAL PREDISTORTION TYPE TRANSMITTER USING SAME, AND WIRELESS BASE STATION

CLAIM OF PRIORITY

The present application claims priority from Japanese application JP 2004-263195 filed on Sep. 10, 2004, the content of which is hereby incorporated by reference into this application.

FIELD OF THE INVENTION

The present invention relates to a delay locked loop (DLL) circuit, and in particular, to a delay locked loop circuit suitable for use in a digital predistortion circuit for compensating for nonlinear distortion occurring to an analog circuit (for example, a power amplifier), in a baseband, a digital predistortion type transmitter using the same, and a wireless base station.

BACKGROUND OF THE INVENTION

With the widespread use of cellular phones, it has lately become essential to make effective use of radio wave resources, and attention is being focused on CDMA, and OFDM as wireless communication systems high in frequency utilization efficiency. It is known that momentary maximum power at about 10 dB or greater against average transmission power occurs to a transmitter at a base station for these systems.

Meanwhile, a power amplifier of the transmitter at the base station has a property such that high efficiency is generally obtained at the time of a large output operation, but there occurs deterioration in linearity at that time because of output saturation. Since such nonlinear distortion causes a transmitted spectrum to spread, resulting in interference with other bands, a quantity of disturbing waves generated is strictly regulated by Wireless Telegraphy Act.

With the transmitter at the base station, it is regarded preferable from the viewpoint of equipment size and running cost to execute operation in a high-efficiency state by raising output amplitude of the power amplifier, however, with CDMA, and OFDM, operation at high efficiency has become difficult to execute because nonlinear distortion is prone to occur thereto.

As a method of overcoming such a problem as described, various method of linearizing the output of the power amplifier by use of distortion-compensating techniques have so far been developed, and as one of such methods, digital predistortion for executing compensation for distortion in a baseband has been well known. The conventional configuration of the digital predistortion includes a configuration wherein a delay unit is made up of an FIR type digital filter (refer to Patent Document 1).

[Patent Document 1] JP-A No. 189685/2001

FIG. 3 shows a configuration example of a digital predistortion type transmitter at a wireless base station, and FIG. 4 shows a configuration of a predistortion unit 303 by way of example.

In FIG. 3, a transmission signal fed from a controller 300 is processed for coding by a modulator 301 to be subsequently subjected to bandwidth control by a baseband-signal-processing unit 302, which outputs quadrature IQ signals Ii, Qi to be further processed for compensation for distortion by a predistortion unit 303 to be thereby converted into analog signals by a D/A converter 304, and a quadrature modulator 305 executes conversion of frequencies of the analog signals into a radio frequency band, whereupon a power amplifier 306 amplifies power, thereby sending out radio waves into the air from an antenna 310 through an antenna sharing unit 309. In this case, nonlinear distortion occurs to the power amplifier 306 at the time of a large output, which, however, can be deemed equivalent to a case where the nonlinear distortion is superimposed on the output of a linear amplifier 307.

In order to effectively implement predistortion, it is necessary to accurately cancel out nonlinear characteristics of the power amplifier 306 by accurately grasping an amount of the nonlinear distortion that has occurred. Accordingly, transmission radio waves are converted in frequency to an IF band with the use of a mixer 311 to be subsequently converted into a digital signal by an A/D converter 312, and the digital signal is demodulated by a digital quadrature demodulator 313 to be thereby fed back to the predistortion unit 303. As for a configuration of a demodulation unit, a digital IF type excellent in demodulation precision has been described, however, various configurations other than that, including an analog quadrature modulator, are conceivable for adoption.

Next, referring to FIG. 4, a configuration of the predistortion unit 303 is described hereinafter. In FIG. 4, s delay unit 104 outputs signals Id, Qd obtained by delaying first input signals Ii, Qi by an integer (n) multiple of sample frequency. A subtractor 103 computes a difference between the signals Id, Qd, and second first input signals Ir, Qr. Based on a differential signal as obtained, an adaptive signal processor 102 controls a predistortor 101 so as to render the differential signal coming to zero. For adaptive signal processing, use is usually made of an algorithm for minimizing the square of an error, that is, distortion power, such as the least mean square algorithm, and recursive least square algorithm, based on the gradient method.

If nonlinear distortion has been accurately extracted by the subtractor 103, reduction in the nonlinear distortion can be implemented as a result of the adaptive signal processing described as above. However, if the extraction of the nonlinear distortion is incomplete, a control error results even in a state where the nonlinear distortion is at zero because the differential signal is not eliminated. In other words, in order to implement effective predistortion, it becomes necessary that delay on a signal path from the predistortor 101 to the quadrature demodulator 313 have been corrected by the delay unit 104.

However, while a delay quantity of the former does not always correspond to an integer multiple of the sample frequency since the same passes through analog elements, a delay quantity of the latter corresponds to nothing but the integer multiple of the sample frequency since the same is generated in a latch circuit. More specifically, if the delay quantity of the former is broken down into a component "n" corresponding to the integer multiple of the sample frequency, and a component "a" less than one sample frequency, the component "n" can be corrected, but it is difficult to correct the component "a."

In Patent Document 1, there is disclosed a technology for correcting a delay quantity "a" less than one sample frequency. In this case, use is made of an FIR filter as means for causing the delay quantity less than one sample frequency to occur. In the case of this example, follow-up property thereof, against variation in delay time, is poor because delay time is decided prior to the start of a distortion-compensation operation. Accordingly, there is disclosed an example of creating a delay locked loop for controlling a clock phase of the A/D converter 312.

With delay correction means using the FIR filter as described in the conventional technology, an amplitude characteristic becomes flat only in the case where a tap factor is "0 0 . . . . . 010 . . . . . 0 0", and when delay is set to less than one sample frequency, there arises a problem that the amplitude characteristic intrinsically has waviness occurring thereto, thereby impairing accuracy in distortion extraction by subtraction. Further, since delay correction is implemented by means of the FIR, there is a tendency that relatively large and redundant delay (corresponding to not less than 16 samples in the case of an embodiment of the conventional technology) is added. thereby creating a factor for interfering with higher speed in adaptive signal processing.

Still further, there is a problem with the delay locked loop as described in the conventional technology in that there is the needs for analog components such as a D/A converter for controlling the clock of the A/D converter 312, a smoothing filter, and a VCO in addition to those components shown in FIG. 3. Furthermore, in addition to an increase in the number of the analog components, there is a problem with the performance thereof in that jitter is prone to occur to clock due to the effect of quantization noises of the D/A converter, and thermal noises of the VCO, and further, the retention capability of control voltage is low due to the effect of an offset voltage, thereby causing the delay locked loop susceptible to be out of sync at the time of no signal.

SUMMARY OF THE INVENTION

The invention has been developed in order to resolve the problem with the conventional technology as described above, and for example, a representative embodiment of the invention is as described hereunder.

That is, the invention provides a delay locked loop circuit which comprises: a variable delay element for receiving first input IQ signals; a subtractor connected to output terminals of the variable delay element, for receiving signals based on output signals of the variable delay element, and second input IQ signals; a delay comparator connected to the output terminals of the variable delay element, for receiving the output signals of the variable delay element; and a smoothing filter connected to an output terminal of the delay comparator, and to an input terminal of the variable delay element, for receiving and smoothing an output signal of the delay comparator, and outputting a smoothed signal to the variable delay element, in which either the first input IQ signals or the second input IQ signals are signals generated as a result of output IQ signals undergoing digital-to-analog conversion, and again undergoing analog-to-digital conversion after passing through an analog circuit, and delay control is implemented for checking distortion occurring to the output IQ signals due to the same passing through the analog circuit by means of the variable delay element.

In particular, with the use of an IIR filter as the variable delay element, the delay locked loop can be fully digitalized as an analog component is eliminated therefrom, so that it becomes possible not only to reduce the number of analog components, but also to avoid the problems of jitter and out-of-sync. Furthermore, since an FIR filter is not in use in this case, amplitude characteristic of the loop can be rendered fully smooth, and redundant delay can be suppressed to an extremely small magnitude.

Thus, with the delay locked loop according to the invention, delay between two kinds of signals can be corrected substantially exactly down to a minute delay less than one sample frequency.

DETAILED DESCRIPTION OF THE PREFERRED EMBODIMENTS

First Embodiment

Figure 1:
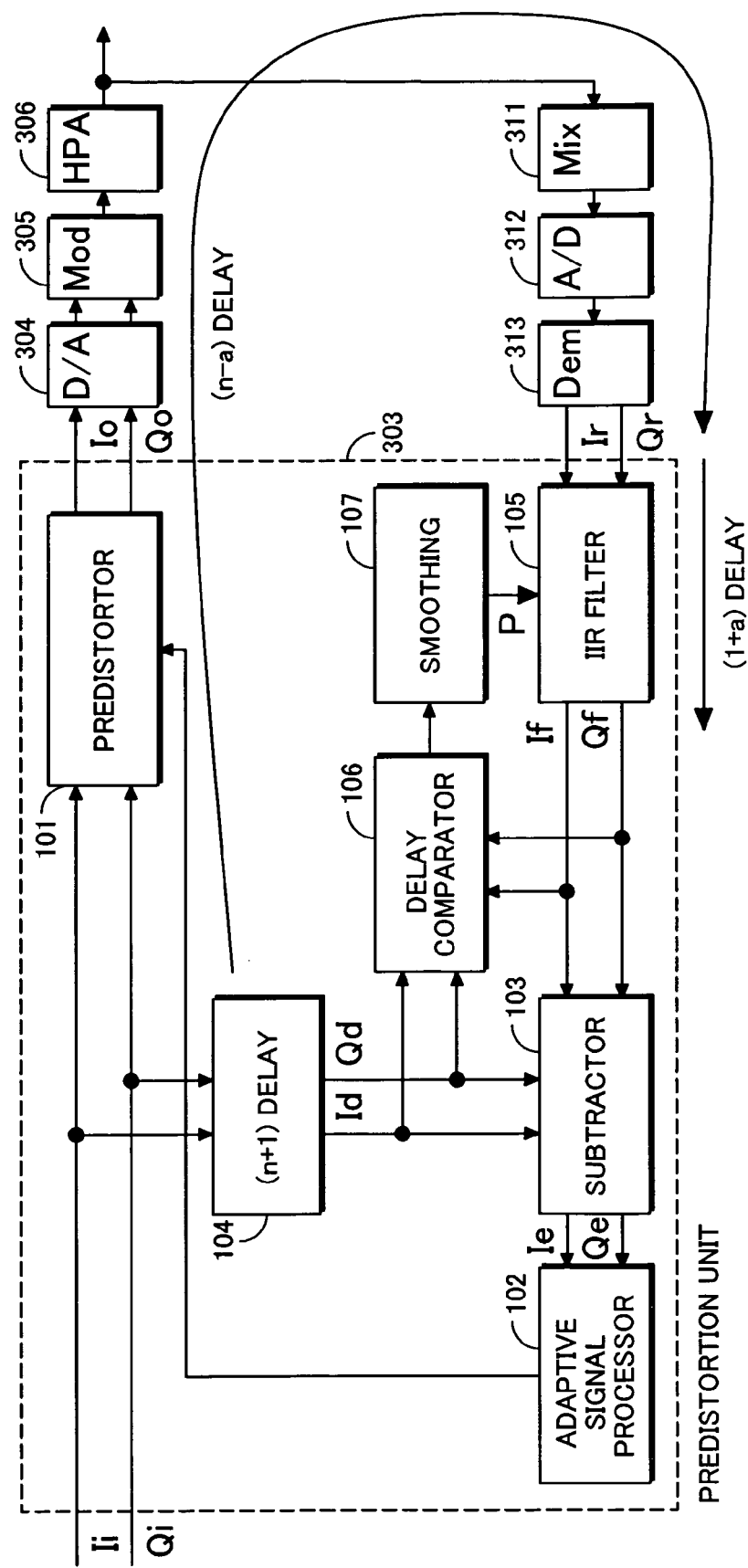
FIG. 1 is a block diagram showing a first embodiment of the invention.
Figure 4:
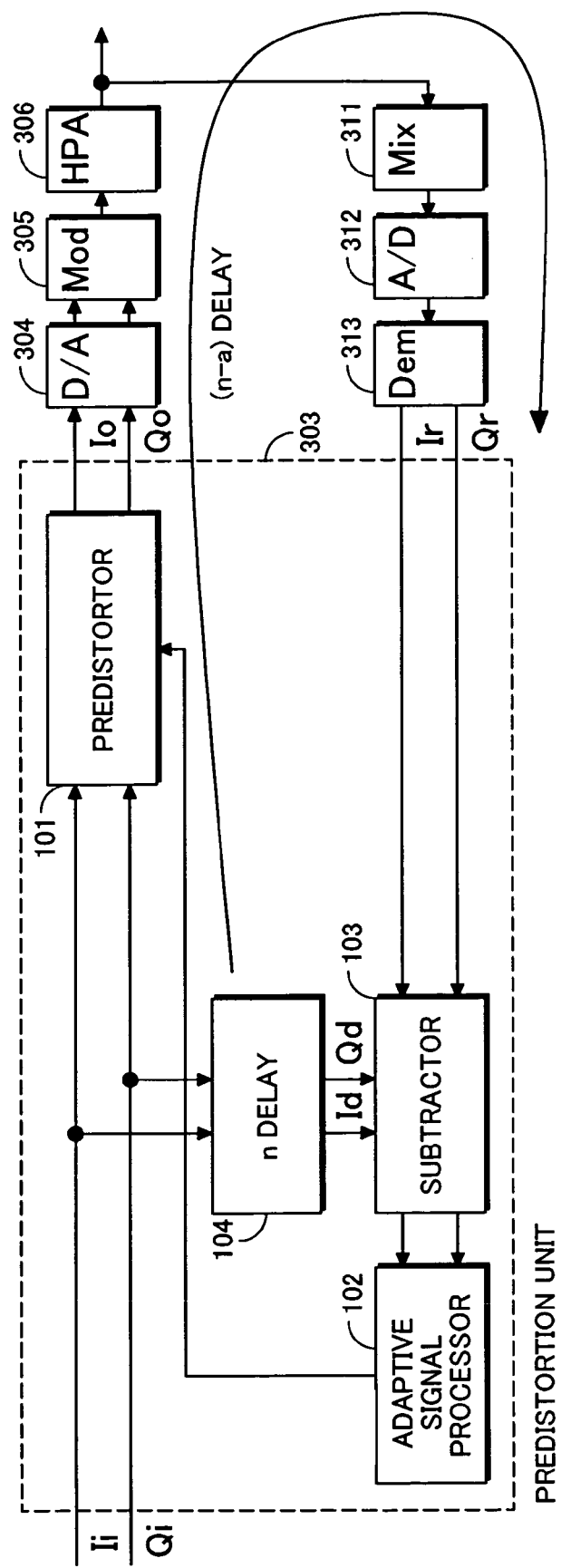
FIG. 4 is a block diagram showing a configuration of a predistortion unit.

A first embodiment of the invention is described hereinafter with reference to the accompanying drawings. A configuration shown in FIG. 1 is the same as the configuration shown in FIG. 4 except that a delay comparator 106, a smoothing filter 107, and an IIR filter 105 are additionally provided. The delay comparator 106 outputs a signal according to a delay difference between signals Id, Qd, which are first input signals Ii, Qi, after delayed, and output signals If, Qf of the IIR filter 105. The smoothing filter 107 outputs a signal P representing an output of the delay comparator 106 after removing high-pass random components thereof. The IIR filter 105 is a filter circuit acting on second input signals Ir, Qr, causing a delay quantity to undergo a change according to the signal P.

Figure 5:
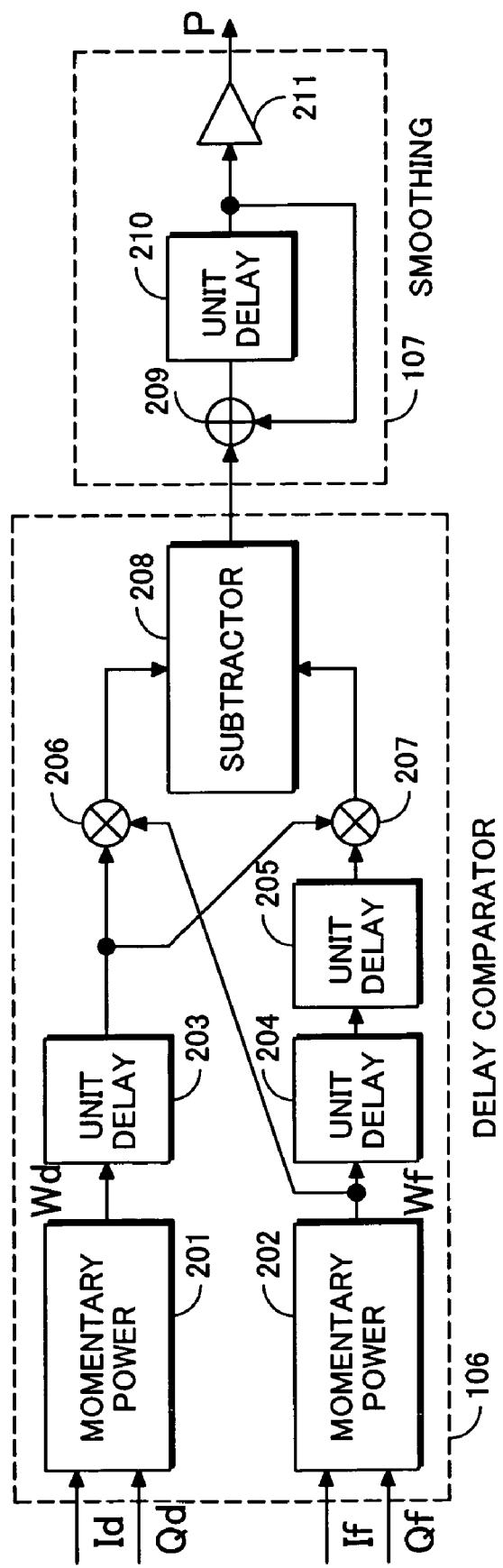
FIG. 5 is a block diagram showing a configuration of a block of delay comparison and smoothing.

FIG. 5 shows respective configurations of the delay comparator 106, and the smoothing filter 107 by way of example. First, on the basis of the reference signals Id, Qd, and the input signals If, Qf, respective momentary powers Wd, Wf are found. To find the respective momentary powers, it is sufficient to calculate the sum of the squares of the respective signals IQ. Subsequently, the momentary power Wd is kept delayed by one sample through a unit delay 203, and the product of the momentary power Wd as delayed and the momentary power Wf is calculated with the use of a multiplier 206. Separately from this, the momentary power Wf is delayed by two samples through unit delays 204, 205, and the product of the momentary power Wf as delayed, and the momentary power Wd as delayed is calculated with the use of a multiplier 207. By calculating a difference between an output of multiplier 206 and an output of multiplier 207, delay comparison based on correlation of the signals can be executed. However, with an output of the delay comparator 106, a time average value contains not only delay information but also the high-pass random components attributable to the signals, so that the output is smoothed out by the smoothing filter 107 before outputting a signal P. As an example of a configuration of the smoothing filter 107, use can be made of an integrator comprising an adder 209, a unit delay 210, and a constant multiplier 211. As the output of the delay comparator 106 becomes zero at the time of no signal, an output of the smoothing filter 107 is retained at a constant value as a result of integration, and since the same is a digital circuit, retention capability thereof is perfect.

Figure 6:
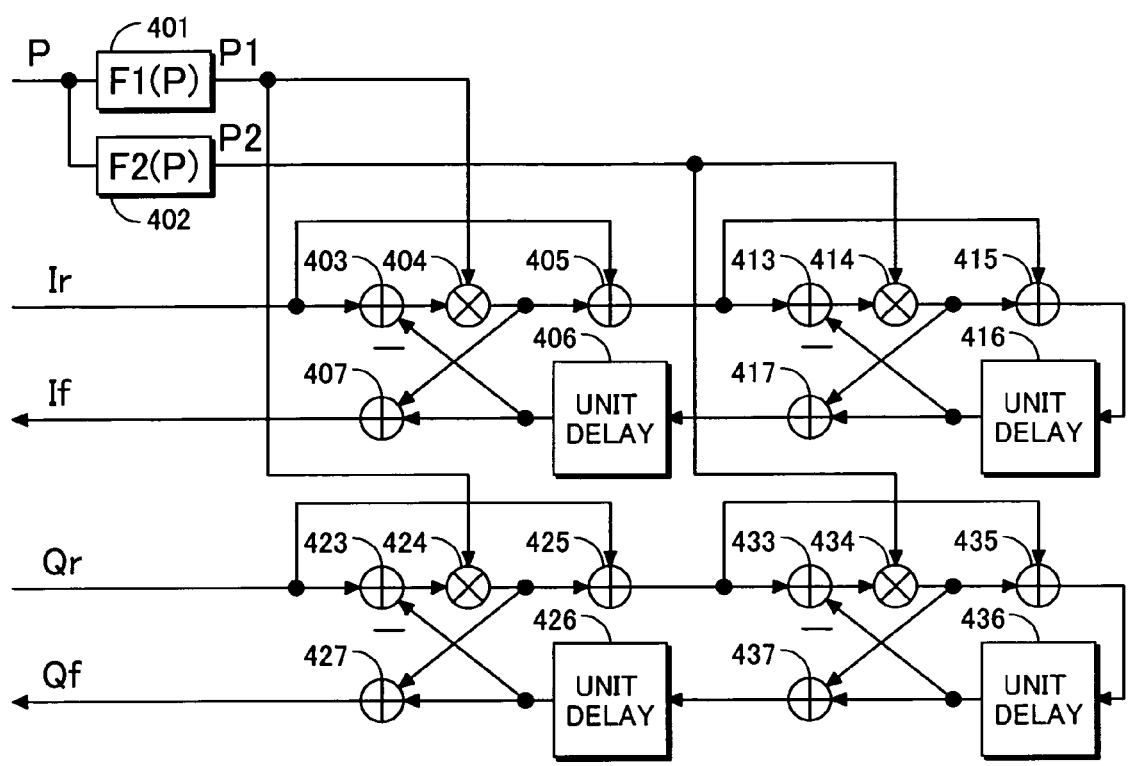
FIG. 6 is a block diagram showing a configuration example of an IIR filter (a lattice secondary all-pass type)

Now, an IIR filter is described hereinafter. Various configurations of the IIR filter are conceivable, and by way of example, there can be cited a lattice secondary all-pass filter as shown in FIG. 6. The transfer function thereof is represented by expression (1), the amplitude characteristic thereof is constant regardless of frequency, and the group delay characteristic thereof varies depending on two parameters, that is, multiplier factors P1, P2:

$$\frac{Iout(z)}{Iin(z)} = \frac{Qout(z)}{Qin(z)} = \frac{P1 + P2(1+P1)z^{-1} + z^{-2}}{1 + P2(1+P1)z^{-1} + P1z^{-2}} \quad (1)$$

In order to constitute a feedback loop, it is required that control be implemented by a single parameter P. Accordingly, functions P1=F1(P), P2=F2(P), based on single parameter P, are set up, and by imposing an appropriate restrictive condition on P1 and P2, the two parameters are reduced to one parameter. Meanwhile, with the IIR filter, it is intrinsically impossible to obtain a linear phase characteristic (group delay smoothing characteristic), so that it is necessary to implement this by approximation. Accordingly, the restrictive condition described is decided in such a way as to give group delay smoothness. However, since various methods of deciding the same are conceivable depending on the method of the approximation, two cases are shown hereinafter.

If the restrictive condition as a first case is decided such that a group delay low-pass characteristic has the maximum smoothness, F1(P), and F2(P) are represented by expression (2):

$$F1(P) = \frac{P(P+1)}{8-P} \cong 0.12P + 0.12P^2 \quad (2)$$

$$F2(P) = \frac{P(P-8)}{8+P_2} \cong -1.04P - 0.03P^2$$

Figure 7:
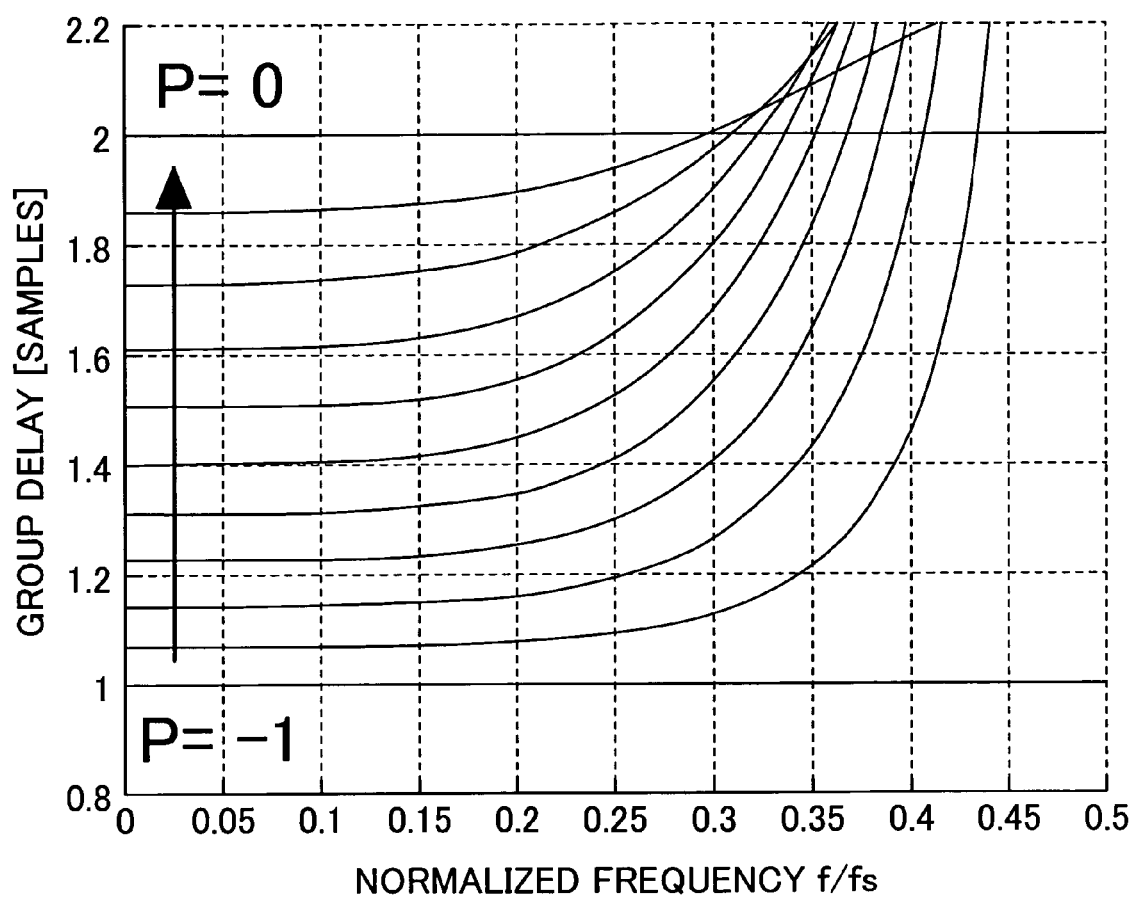
FIG. 7 is a diagram showing frequency characteristics in the case of the group delay characteristics being at the maximum smoothness.

Shown in FIG. 7 is a frequency characteristic diagram obtained by plotting the group delay characteristics in this case, using the parameter P as a parameter. The group delay smoothness in a low-pass range is found extremely good, but an increase in frequency is accompanied by large variation in delay.

If a condition is added as a second case such that a group delay quantity at f=0 is equal to a group delay quantity at f=fs/4, F1(P), and F2(P) are represented by expression (3):

$$F1(P) = \frac{P(P+1)}{4-P} \cong 0.23P + 0.24P^2 \quad (3)$$

$$F2(P) = \frac{P(P-4)}{4+P_2} \cong -1.08P - 0.06P^2$$

Figure 8:
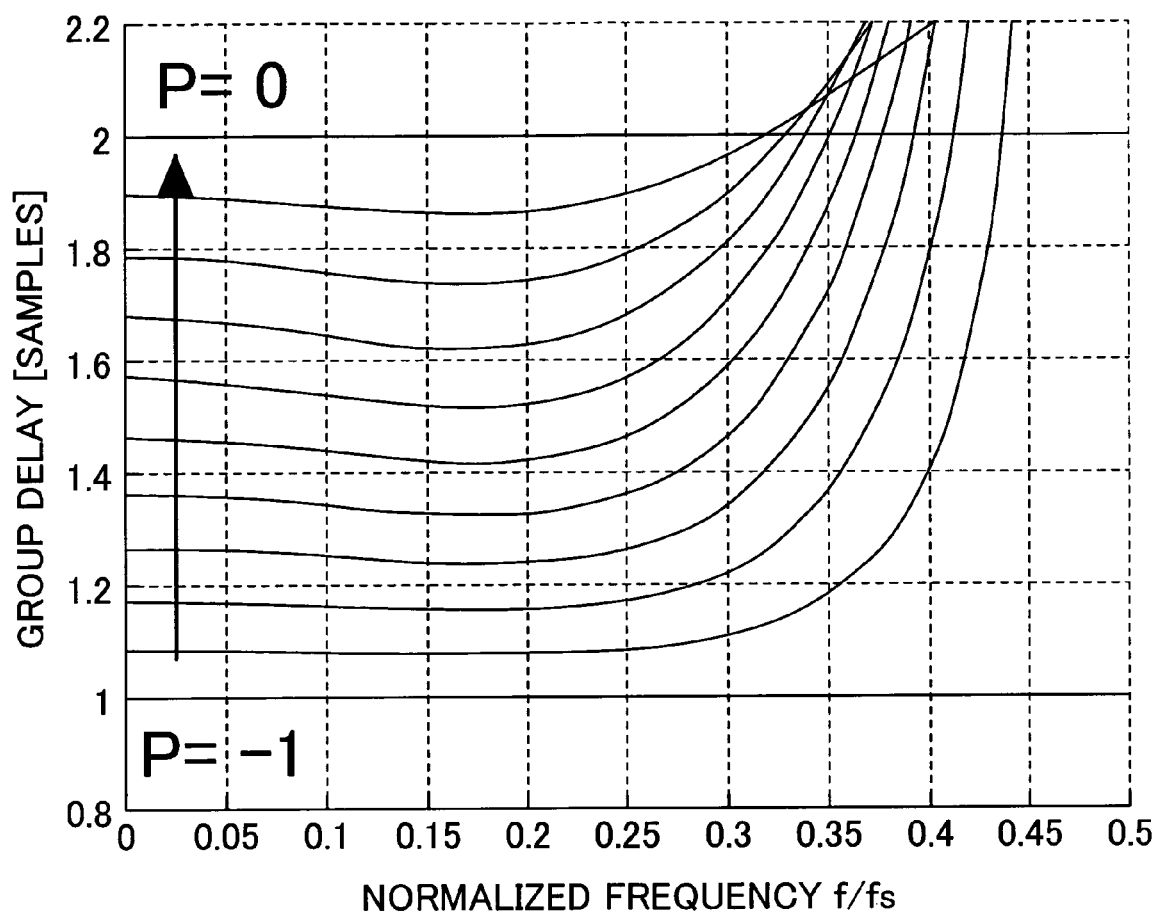
FIG. 8 is a diagram showing the frequency characteristics in the case of the frequency characteristics being rendered wider in bandwidth ranging from f=0 to f=fs/4.

Shown in FIG. 8 is a frequency characteristic diagram obtained by plotting the group delay characteristics in this case, using the parameter P as a parameter. Group delay is found somewhat wavy in a range of f=0 to f=fs/4; however, if such waviness is permissible, the frequency characteristics are deemed to be wider in bandwidth than in the first case. In either case, by varying the parameter P in a range of −1 to 0, the delay quantity can be continuously varied from one sample up to two samples.

Further, exact formulas of the functions of F1(P), and F2(P), respectively, are based on the four fundamental rules of arithmetic, and can therefore be implemented in a digital circuit, however, it need only be sufficient to execute multiplication and addition by employing polynomial approximation as described in expressions (2), and (3), thereby simplifying calculation. Furthermore, if relationships between corresponding functions are stored in a table, the exact formulas can be implemented even without execution of calculation.

With the present embodiment of the invention, the delay comparator 106, the smoothing filter 107, and the IIR filter 105 make up the delay locked loop, and by setting a delay quantity of the delay unit 104 to (n+1), timing of the output of the delay unit 104 can be coincided with that of the output of the IIR filter 105, thereby enabling accurate extraction of a distortion component to be implemented by the subtractor 103. Further, in contrast to the conventional technology, the delay locked loop is fully digitalized, so that the same is resistant to the effect of noises, and will not be out of sync at the time of no signal because the output of the smoothing filter 107 is retained without being affected by an offset. Furthermore, since the FIR filter is not in use, amplitude characteristic of the loop is theoretically smooth, so that redundant delay can be suppressed to an extremely small magnitude.

Second Embodiment

Figure 2:
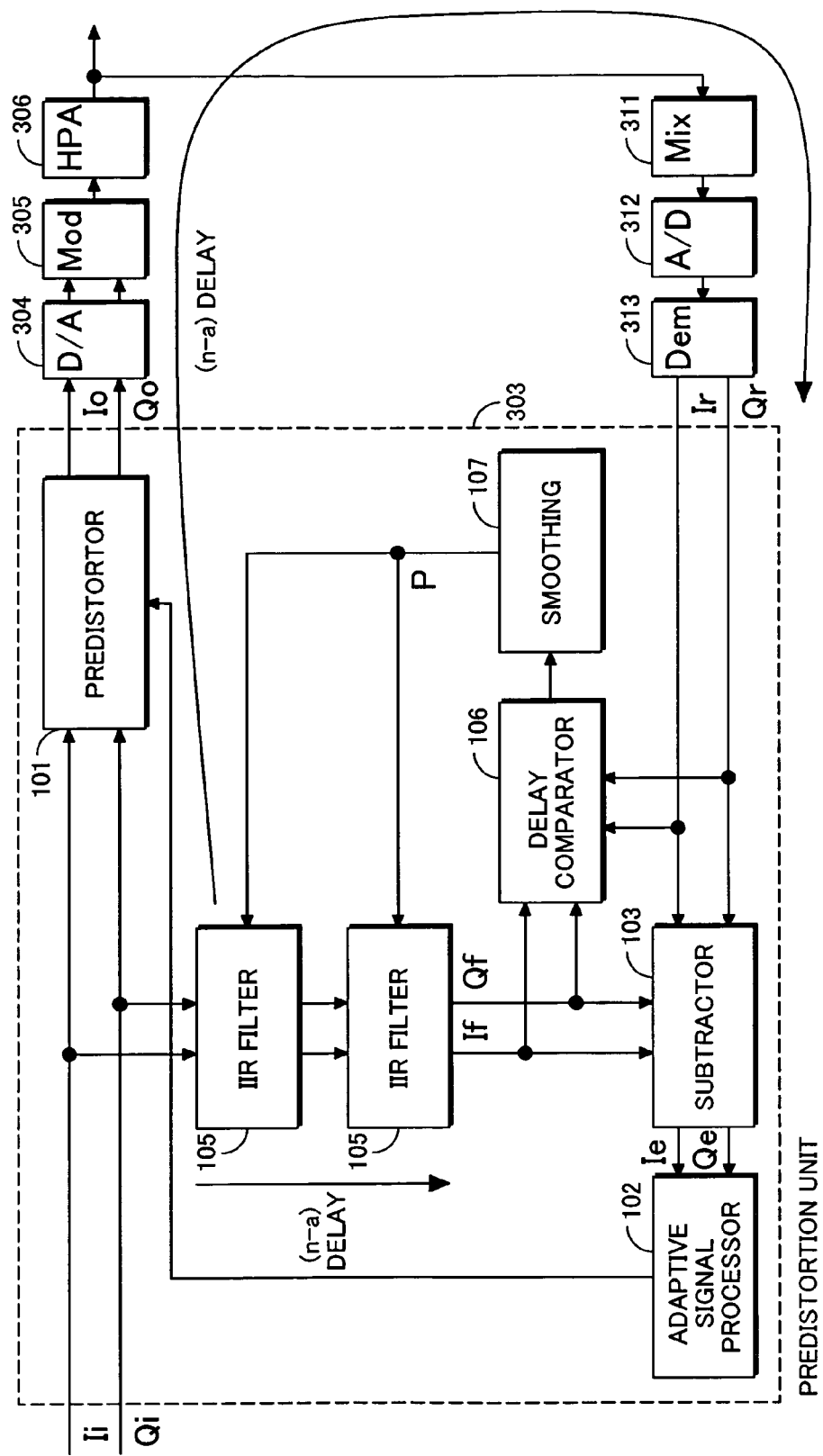
FIG. 2 is a block diagram showing a second embodiment of the invention.
Figure 3:
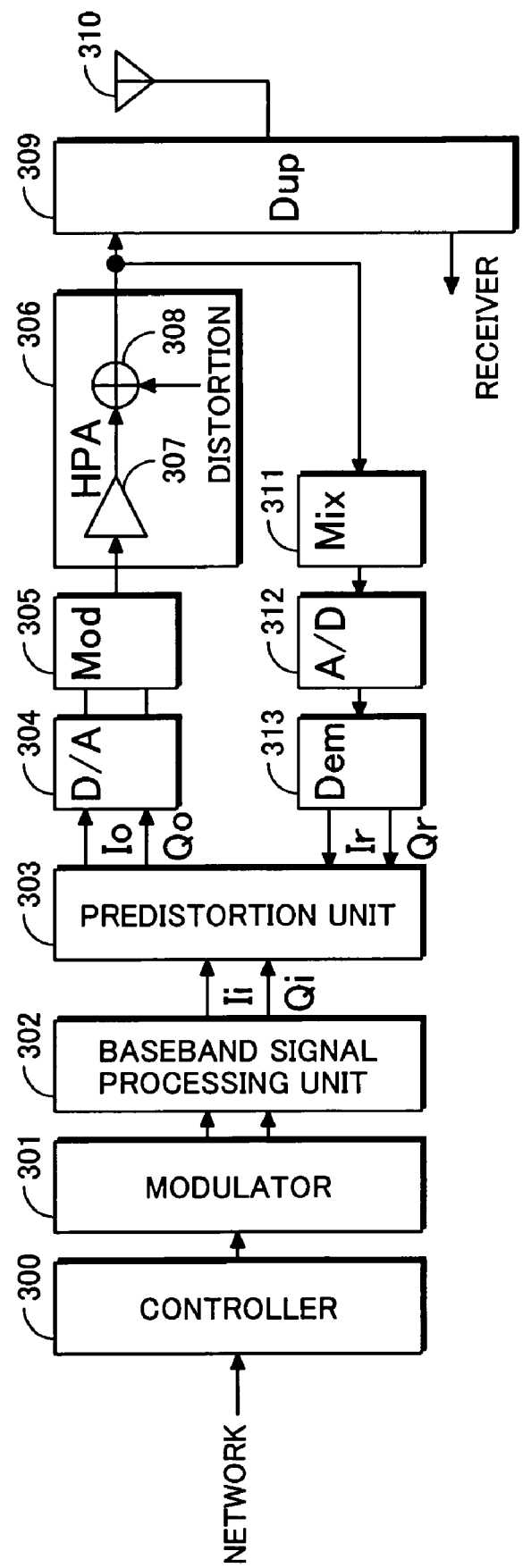
FIG. 3 is a block diagram showing a configuration of a predistortion type transmitter at a wireless base station.

Next, a second embodiment of the invention is described hereinafter with reference to FIG. 2. With a configuration shown in FIG. 2, IIR filters 105 are in use in place of the delay unit 104 in FIG. 1. A delay comparator 106 outputs a signal according to a delay difference between first input signals Ir, Qr, and output signals If, Qf of the IIR filters 105. The smoothing filter 107 outputs a signal P corresponding to an output of the delay comparator 106 after removing high-pass random components thereof. The IIR filters 105 represent a filter circuit acting on second input signals Ii, Qi, causing a delay quantity to undergo a change according to the signal P. FIG. 2 shows a case where the IIR filters are provided in two stages, however, it is to be pointed out that the invention is not limited thereto. That is, the IIR filter in one stage may be provided or the IIR filters in not less than three stages (generally, in n-stages) (n: an integer not less than 1). If the IIR filters in the n-stages are provided, the sum of delay quantities of respective element IIR filters in the n-stages are obtained, as If, Qf, from the output terminal of the element IIR filter in the last stage.

The configuration of the present embodiment is not limited to a configuration shown in FIG. 2, and may include various other variations. For example, FIG. 2 shows the configuration wherein the IIR filters 105 are disposed in front-end stages of a predistortor 101, however, the present embodiment is not limited thereto, and the IIR filters 105 may be disposed in back-end stages of the predistortor 101, or some thereof disposed in the front-end stages may be combined with others disposed in the back-end stages such that the IIR filters 105 may be divided in such a way as to be disposed at several locations.

With the present embodiment, a delay quantity along a signal path from the predistortor 101 to a subtractor 103 can be minimized while a variable range of the delay quantity can be rendered wider. Further, in contrast to the conventional technology, the delay locked loop is fully digitalized, so that the same is resistant to the effect of noises, and will not be out of sync at the time of no signal because the output of the smoothing filter 107 is retained without being affected by an offset. Furthermore, since the FIR filter is not in use, amplitude characteristic of the loop is theoretically smooth, so that redundant delay can be suppressed to an extremely small magnitude.

Third Embodiment

Figure 9:
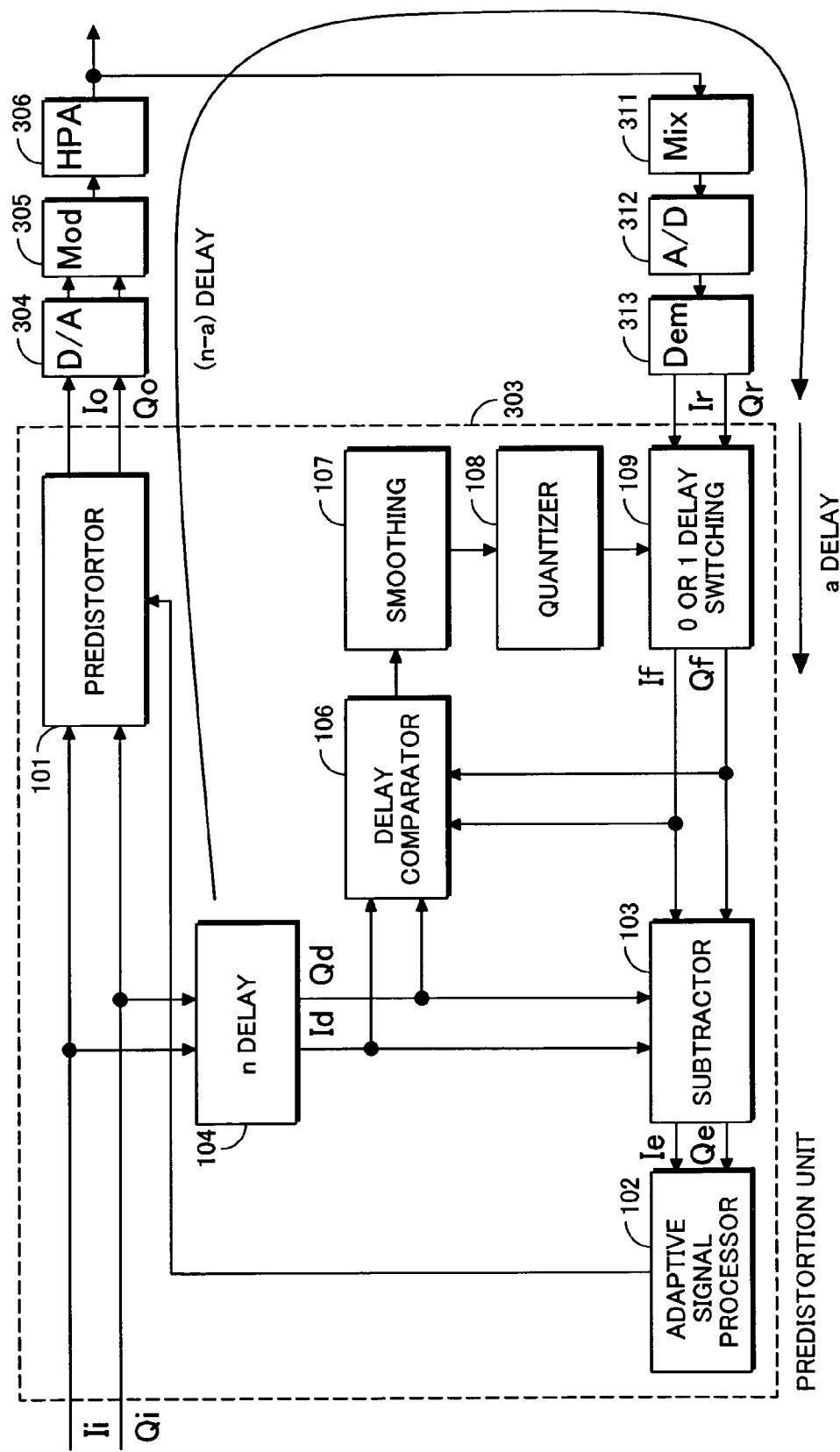
FIG. 9 is a block diagram showing a third embodiment of the invention.

Now, a third embodiment of the invention is described hereinafter with reference to FIG. 9. In FIG. 9, in stead of using the IIR filters as variable delay elements, use is made of a quantizer 108 for binary-quantizing an output of a smoothing filter 107, and a 0/1 delay switching unit 109 configured so as to be capable of selecting either 0-sample delay or one-sample delay (selectively switching therebetween) according to an output value of the quantizer 108. A delay comparator 106 outputs a signal according to a delay difference between signals Id, Qd, corresponding to first input signals Ii, Qi, after delayed, and output signals If, Qf of the 0/1 delay switching unit 109. The smoothing filter 107 outputs a signal P corresponding to an output of the delay comparator 106 after removing high-pass random components thereof. The quantizer 108 receives the signal P, and executes quantization for binarization of the same, thereby outputting a binary output value (for example, 0 or 1), corresponding to the signal P, to the 0/1 delay-switching unit 109. The 0/1 delay-switching unit 109 causes a delay quantity of second input signals Ir, Qr, to undergo a change according to a binary input value (for example, 0 or 1) corresponding to the signal P, thereby outputting signals If, Qf.

With the present embodiment, since the delay quantity is insufficient at the time of 0-sample delay, and is excessive at the time of 1-sample delay, switching of the delay quantity is automatically implemented by the sigma-delta modulation that is well known as a feedback operation, so that it is possible to set a delay quantity "a" less than one sample on average. Accordingly, switching of the delay quantity can be executed at a sufficiently high speed in comparison with a signal bandwidth, thereby obtaining an advantageous effect equivalent to that of the first embodiment without use of the IIR filter.

Fourth Embodiment

The present embodiment is an example of a digital predistortion type transmitter (a transmission system at a wireless base station), to which the delay locked loop according the invention is applied. A transmission signal fed from a controller 300 is processed for coding by a modulator 301 to be subsequently subjected to bandwidth control by a baseband-signal-processing unit 302, which outputs quadrature IQ signals Ii, Qi to be further processed for compensation of distortion by a predistortion unit 303 to be thereby converted into analog signals by a D/A converter 304, and an quadrature modulator 305 executes conversion of frequencies thereof into a radio frequency band, whereupon a power amplifier 306 amplifies power, thereby sending out radio waves into the air from an antenna 310 through an antenna sharing unit 309. For the predistortion unit 303, use is made of any of the first to three embodiments described in the foregoing, or various variations thereof. In this case, nonlinear distortion occurs to the power amplifier 306 at the time of a large output, which, however, can be deemed equivalent to a case where the nonlinear distortion is superimposed on the output of a linear amplifier 307.

In order to effectively implement predistortion, it is necessary to accurately cancel out nonlinear characteristics of the power amplifier 306 by accurately grasping an amount of the nonlinear distortion that has occurred. Accordingly, transmission radio waves are converted in frequency to an IF band through a mixer 311 to be subsequently converted into a digital signal by an A/D converter 312, whereupon the digital signal is demodulated by a digital quadrature demodulator 313 to be thereby fed back to the predistortion unit 303. As for a configuration of the demodulator, various configurations other than the one described are conceivable for adoption as in the case of the conventional demodulator.

With the present embodiment, the nonlinear distortion that has occurred to the power amplifier 306 can be accurately extracted by applying the delay locked loop according the invention to the digital predistortion type transmitter, so that it is possible to implement compensation for distortion, with few errors.

Fifth Embodiment

The present embodiment is an example of a wireless base station, to a transmission system of which the digital predistortion type transmitter according to the fourth embodiment of the invention is applied. The present embodiment is the same in configuration as the fourth embodiment except that a signal reception system is connected to the antenna sharing unit 309. The antenna sharing unit 309 outputs a received signal delivered via the antenna 310 to the signal reception system while receiving a transmission signal amplified in power by the power amplifier 306 of the transmission system, and outputting the transmission signal to the antenna 310. As for a specific configuration of the signal reception system, various well known forms can be used.

With the present embodiment, because the effect of signal delay is compensated for, and nonlinear distortion can be accurately extracted, control error in adaptive signal processing can be reduced, thereby enhancing linearity. Accordingly, since compensation for nonlinear distortion is appropriately implemented even at the time of a large amplitude, output at a large amplitude is enabled, thereby enabling operation in a high-efficiency state to be implemented.

What is claimed is:

1. A delay locked loop circuit comprising:

an all-pass IIR filter for receiving first input IQ signals;

a subtractor connected to output terminals of the all-pass IIR filter, for receiving signals based on output signals of the all-pass IIR filter, and second input IQ signals;

a delay comparator connected to the output terminals of the all-pass IIR filter, for receiving the output signals of the all-pass IIR filter; and a smoothing filter connected to an output terminal of the delay comparator, and to an input terminal of the all-pass IIR filter, for receiving and smoothing an output signal of the delay comparator, and outputting a smoothed signal as an integration value to the all-pass IIR filter wherein the all-pass IIR filter is controlled by the integration value, wherein either the first input IQ signals or the second input IQ signals are signals generated as a result of output IQ signals undergoing digital-to-analog conversion, and again undergoing analog-to-digital conversion after passing through an analog circuit, and delay control is implemented for checking distortion occurring to the output IQ signals due to the same passing through the analog circuit by means of a variable delay element.

2. A delay locked loop circuit according to claim 1, wherein the first input IQ signals are generated as a result of the output IQ signals undergoing digital-to-analog conversion, and again undergoing analog-to-digital conversion after passing through the analog circuit, the second input IQ signals are delayed by a delay unit for providing input signals with delay corresponding to an integer multiple of sample frequency, output signals of the delay unit are delivered to the subtractor, and the delay comparator, respectively, the delay comparator is configured such that a signal according to a delay difference between the output signals of the delay unit, and output signals of the IIR filter is sent out to the smoothing filter, and coefficients of multipliers inside the IIR filter are controlled on the basis of an output of the smoothing filter.

3. A delay locked loop circuit according to claim 1, wherein the IIR filter comprises element IIR filters in at least one stage, connected in series, and the sum of respective delay quantities of the element IIR filters is sent out from an output terminal of the element IIR filter in the last stage.

4. A delay locked loop circuit according to claim 3, wherein the first input IQ signals are delayed by the IIR filter, output signals of the IIR filter are delivered to the subtractor, and the delay comparator, respectively, the second input IQ signals are generated as a result of the output IQ signals undergoing digital-to-analog conversion, and again undergoing analog-to-digital conversion after passing through the analog circuit, the delay comparator is configured such that a signal according to a delay difference between output signals of the IIR filter, and the second input IQ signals is sent out to the smoothing filter, and coefficients of multipliers inside the respective element IIR filters constituting the IIR filter are controlled on the basis of an output of the smoothing filter.

5. A delay locked loop circuit according to claim 1, wherein the variable delay element comprises a quantizer for binary-quantizing an output signal of the smoothing filter, and a 0/1 delay switching unit configured so as to be capable of selecting either 0-sample delay or one-sample delay according to an output value of the quantizer.

6. A delay locked loop circuit according to claim 5, wherein the first input IQ signals are generated as a result of the output IQ signals undergoing digital-to-analog conversion, and again undergoing analog-to-digital conversion after passing through the analog circuit, the second input IQ signals are delayed by a delay unit for providing input signals with delay corresponding to an integer multiple of sample frequency, output signals of the delay unit are delivered to the subtractor, and the delay comparator, respectively, the delay comparator is configured such that a signal according to a delay difference between the output signals of the delay unit, and output signals of the 0/1 delay switching unit is sent out to the smoothing filter, and a delay quantity inside the 0/1 delay switching unit is switched over on the basis of an output of the smoothing filter.

7. A digital predistortion type transmitter comprising:
a controller connected to a network, for receiving a transmission signal fed via the network;
a modulator connected to the controller, for receiving the transmission signal fed from the controller, and processing the same for coding;
a baseband-signal-processing unit connected to the modulator for receiving modulated transmission signal fed from the modulator, and executing bandwidth control of the same before outputting quadrature IQ signals;
a predistortion unit connected to the baseband-signal-processing unit, for receiving the quadrature IQ signals fed from the baseband-signal-processing unit, and processing the same for distortion compensation;
a D/A converter connected to the predistortion unit, for receiving transmission signals processed for distortion compensation, and converting the same into analog signals;
an quadrature modulator connected to the D/A converter, for receiving the analog signals fed from the D/A converter, and executing conversion of frequencies thereof into a radio frequency band;
a power amplifier connected to the quadrature modulator, for receiving a transmission signal at a radio frequency, fed from the quadrature modulator, and amplifying power of the transmission signal;
an antenna electrically continuous with the power amplifier, for sending out the transmission signal amplified in power, fed from the power amplifier, as radio waves;
a mixer connected to the power amplifier, for receiving the transmission signal amplified in power, fed from the power amplification, and converting the same in frequency to an intermediate frequency band;
an A/D converter connected to the mixer, for receiving a signal at the intermediate frequency, fed from the mixer, and converting the same into a digital signal;
a digital quadrature demodulator connecting the A/D converter to the predistortion unit, for receiving the digital signal to be thereby demodulated, and outputting demodulated digital signals to the predistortion unit,
the predistortion unit comprising:
an all-pass IIR filter for receiving first input IQ signals;
a subtractor connected to output terminals of the all-pass IIR filter, for receiving signals based on output signals of the all-pass IIR filter, and second input IQ signals;
a delay comparator connected to the output terminals of the all-pass IIR filter, for receiving the output signals of the all-pass IIR filter; and
a smoothing filter connected to an output terminal of the delay comparator, and to an input terminal of the all-pass IIR filter, for receiving and smoothing an output signal of the delay comparator, and outputting a smoothed signal as an integration value to the all-pass IIR filter wherein the all-pass IIR filter is controlled by the integration value,
wherein either the first input IQ signals or the second input IQ signals are output signals of the digital quadrature demodulator, and delay control is implemented for checking distortion occurring to the transmission signal at the power amplifier by means of a variable delay element.

8. A digital predistortion type transmitter according to claim 7, wherein
the first input IQ signals are generated as a result of the output IQ signals undergoing digital-to-analog conversion, and again undergoing analog-to-digital conversion after passing through the analog circuit,
the second input IQ signals are delayed by a delay unit for providing input signals with delay corresponding to an integer multiple of sample frequency, output signals of the delay unit are delivered to the subtractor, and the delay comparator, respectively, the delay comparator is configured such that a signal according to a delay difference between the output signals of the delay unit, and output signals of the IIR filter is sent out to the smoothing filter, and coefficients of multipliers inside the IIR filter are controlled on the basis of an output of the smoothing filter.

9. A digital predistortion type transmitter according to claim 7, wherein the IIR filter comprises element IIR filters in at least one stage, connected in series, and the sum of respective delay quantities of the element IIR filters is sent out from an output terminal of the element IIR filter in the last stage.

10. A digital predistortion type transmitter according to claim 9, wherein the first input IQ signals are delayed by the IIR filter, output signals of the IIR filter are delivered to the subtractor, and the delay comparator, respectively, the second input IQ signals are generated as a result of the output IQ signals undergoing digital-to-analog conversion, and again undergoing analog-to-digital conversion after passing through the analog circuit, the delay comparator is configured such that a signal according to a delay difference between output signals of the IIR filter, and the second input IQ signals is sent out to the smoothing filter, and coefficients of multipliers inside the respective element IIR filters constituting the IIR filter are controlled on the basis of an output of the smoothing filter.

11. A digital predistortion type transmitter according to claim 7, wherein the variable delay element comprises a quantizer for binary-quantizing an output signal of the smoothing filter, and a 0/1 delay switching unit configured so as to be capable of selecting either 0-sample delay or one-sample delay according to an output value of the quantizer.

12. A digital predistortion type transmitter according to claim 11, wherein the first input IQ signals are generated as a result of the output IQ signals undergoing digital-to-analog conversion, and again undergoing analog-to-digital conversion after passing through the analog circuit, the second input IQ signals are delayed by a delay unit for providing input signals with delay corresponding to an integer multiple of sample frequency, output signals of the delay unit are delivered to the subtractor, and the delay comparator, respectively, the delay comparator is configured such that a signal according to a delay difference between the output signals of the delay unit, and output signals of the 0/1 delay switching unit is sent out to the smoothing filter, and a delay quantity inside the 0/1 delay switching unit is switched over on the basis of an output of the smoothing filter.

13. A wireless base station comprising:

a controller connected to a network, for receiving a transmission signal fed via the network;

a modulator connected to the controller, for receiving the transmission signal fed from the controller, and processing the same for coding;

a baseband-signal-processing unit connected to the modulator for receiving modulated transmission signal fed from the modulator, and executing bandwidth control of the same before outputting quadrature IQ signals;

a predistortion unit connected to the baseband-signal-processing unit, for receiving the quadrature IQ signals fed from the baseband-signal-processing unit, and processing the same for distortion compensation;

a D/A converter connected to the predistortion unit, for receiving transmission signals processed for distortion compensation, and converting the same into analog signals;

an quadrature modulator connected to the D/A converter, for receiving the analog signals fed from the D/A converter, and executing conversion of frequencies thereof into a radio frequency band;

a power amplifier connected to the quadrature modulator, for receiving a transmission signal at a radio frequency, fed from the quadrature modulator, and amplifying power of the transmission signal;

an antenna sharing unit connected to an output terminal of the power amplifier, and to an input terminal of a signal reception system, for receiving the transmission signal amplified in power, fed from the power amplifier, to be sent out to an antenna while receiving a received signal fed from the antenna, and sending out the same to the signal reception system;

a mixer connected to the power amplifier, for receiving the transmission signal amplified in power, fed from the power amplifier, and converting the same in frequency to an intermediate frequency band;

an A/D converter connected to the mixer, for receiving a signal at the intermediate frequency, fed from the mixer, and converting the same into a digital signal;

a digital quadrature demodulator connecting the A/D converter to the predistortion unit, for receiving the digital signal to be thereby demodulated, and outputting demodulated digital signals to the predistortion unit;

the predistortion unit comprising:

an all-pass IIR filter for receiving first input IQ signals;

a subtractor connected to output terminals of the all-pass IIR filter, for receiving signals based on output signals of the all-pass IIR filter, and second input IQ signals;

a delay comparator connected to the output terminals of the all-pass IIR filter, for receiving the output signals of the all-pass IIR filter; and a smoothing filter connected to an output terminal of the delay comparator, and to an input terminal of the all-pass IIR filter, for receiving and smoothing an output signal of the delay comparator, and outputting a smoothed signal as an integration value to the all-pass IIR filter wherein the all-pass IIR filter is controlled by the integration value, wherein either the first input IQ signals or the second input IQ signals are output signals of the digital quadrature demodulator, and delay control is implemented for checking distortion occurring to the transmission signal at the power amplifier by means of a variable delay element.

14. A wireless base station according to claim 13, wherein the first input IQ signals are generated as a result of the output IQ signals undergoing digital-to-analog conversion, and again undergoing analog-to-digital conversion after passing through the analog circuit, the second input IQ signals are delayed by a delay unit for providing input signals with delay corresponding to an integer multiple of sample frequency, output signals of the delay unit are delivered to the subtractor, and the delay comparator, respectively, the delay comparator is configured such that a signal according to a delay difference between the output signals of the delay unit, and output signals of the IIR filter is sent out to the smoothing filter, and coefficients of multipliers inside the IIR filter are controlled on the basis of an output of the smoothing filter.

15. A wireless base station according to claim 13, wherein the IIR filter comprises element IIR filters in at least one stage, connected in series, and the sum of respective delay quantities of the element IIR filters is sent out from an output terminal of the element IIR filter in the last stage.

16. A wireless base station according to claim 15, wherein
the first input IQ signals are delayed by the IIR filter, output signals of the IIR filter are delivered to the subtractor, and the delay comparator, respectively,
the second input IQ signals are generated as a result of the output IQ signals undergoing digital-to-analog conversion, and again undergoing analog-to-digital conversion after passing through the analog circuit,
the delay comparator is configured such that a signal according to a delay difference between output signals of the IIR filter, and the second input IQ signals is sent out to the smoothing filter, and
coefficients of multipliers inside the respective element IIR filters constituting the IIR filter are controlled on the basis of an output of the smoothing filter.

17. A wireless base station according to claim 13, wherein the variable delay element comprises a quantizer for binary-quantizing an output signal of the smoothing filter, and a 0/1 delay switching unit configured so as to be capable of selecting either 0-sample delay or one-sample delay according to an output value of the quantizer.

18. A wireless base station according to claim 17, wherein
the first input IQ signals are generated as a result of the output IQ signals undergoing digital-to-analog conversion, and again undergoing analog-to-digital conversion after passing through the analog circuit,
the second input IQ signals are delayed by a delay unit for providing input signals with delay corresponding to an integer multiple of sample frequency, output signals of the delay unit are delivered to the subtractor, and the delay comparator, respectively,
the delay comparator is configured such that a signal according to a delay difference between the output signals of the delay unit, and output signals of the 0/1 delay switching unit is sent out to the smoothing filter, and
a delay quantity inside the 0/1 delay switching unit is switched over on the basis of an output of the smoothing filter.

19. A delay locked loop circuit according to claim 1,
wherein the all-pass IIR filter is a lattice secondary all-pass filter as shown in the expression (1),
when a group delay low-pass characteristics a maximum smoothness, P1 and P2 of the expression (1) are represented by expression (2),
the parameter P of the expression (2) varies between −1 and 0, $$\frac{Iout(z)}{Iin(z)} = \frac{Qout(z)}{Qin(z)} = \frac{P1 + P2(1+P1)z^{-1} + z^{-2}}{1 + P2(1+P1)z^{-1} + P1z^{-2}} \quad (1)$$

$$F1(P) = \frac{P(P+1)}{8-P} \cong 0.12P + 0.12P^2 \quad (2)$$

$$F2(P) = \frac{P(P-8)}{8+P^2} \cong -1.04P - 0.03P^2.$$

20. A delay locked loop circuit according to claim 1,
wherein the all-pass IIR filter is a lattice secondary all-pass filter as shown in the expression (1),
when a group delay quantity at f=0 is equal to a group delay quantity at f=fs/4, P1 and P2 of the expression (1) are represented by expression (3),
the parameter P of the expression (3) varies between −1 and 0, $$\frac{Iout(z)}{Iin(z)} = \frac{Qout(z)}{Qin(z)} = \frac{P1 + P2(1+P1)z^{-1} + z^{-2}}{1 + P2(1+P1)z^{-1} + P1z^{-2}} \quad (1)$$

$$F1(P) = \frac{P(P+1)}{4-P} \cong 0.23P + 0.24P^2 \quad (3)$$

$$F2(P) = \frac{P(P-4)}{4+P^2} \cong -1.08P - 0.06P^2.$$

21. A digital predistortion type transmitter according to claim 7,
wherein the all-pass IIR filter is a lattice secondary all-pass filter as shown in the expression (1),
when a group delay low-pass characteristics has a maximum smoothness, P1 and P2 of the expression (1) are represented by expression (2),
the parameter P of the expression (2) varies between −1 and 0, $$\frac{Iout(z)}{Iin(z)} = \frac{Qout(z)}{Qin(z)} = \frac{P1 + P2(1+P1)z^{-1} + z^{-2}}{1 + P2(1+P1)z^{-1} + P1z^{-2}} \quad (1)$$

$$F1(P) = \frac{P(P+1)}{8-P} \cong 0.12P + 0.12P^2 \quad (2)$$

$$F2(P) = \frac{P(P-8)}{8+P^2} \cong -1.04P - 0.03P^2.$$

22. A digital predistortion type transmitter according to claim 7,
wherein the all-pass IIR filter is a lattice secondary all-pass filter as shown in the expression (1),
when a group delay quantity at f=0 is equal to a group delay quantity at f=fs/4, P1 and P2 of the expression (1) are represented by expression (3),
the parameter P of the expression (3) varies between −1 and 0, $$\frac{Iout(z)}{Iin(z)} = \frac{Qout(z)}{Qin(z)} = \frac{P1 + P2(1+P1)z^{-1} + z^{-2}}{1 + P2(1+P1)z^{-1} + P1z^{-2}} \quad (1)$$

$$F1(P) = \frac{P(P+1)}{4-P} \cong 0.23P + 0.24P^2 \quad (3)$$

$$F2(P) = \frac{P(P-4)}{4+P^2} \cong -1.08P - 0.06P^2.$$

23. A wireless base station according to claim 13,
wherein the all-pass IIR filter is a lattice secondary all-pass filter as shown in the expression (1),
when a group delay low-pass characteristics has a maximum smoothness, P1 and P2 of the expression (1) are represented by expression (2),
the parameter P of the expression (2) varies between −1 and 0, $$\frac{Iout(z)}{Iin(z)} = \frac{Qout(z)}{Qin(z)} = \frac{P1 + P2(1+P1)z^{-1} + z^{-2}}{1 + P2(1+P1)z^{-1} + P1z^{-2}} \quad (1)$$

-continued $$F1(P) = \frac{P(P+1)}{8-P} \cong 0.12P + 0.12P^2 \quad (2)$$

$$F2(P) = \frac{P(P-8)}{8+P^2} \cong -1.04P - 0.03P^2.$$

24. A wireless base station according to claim 13,
wherein the all-pass IIR filter is a lattice secondary all-pass filter as shown in the expression (1),
when a group delay quantity at f=0 is equal to a group delay quantity at f=fs/4, P1 and P2 of the expression (1) are represented by expression (3), the parameter P of the expression (3) varies between −1 and 0, $$\frac{Iout(z)}{Iin(z)} = \frac{Qout(z)}{Qin(z)} = \frac{P1 + P2(1+P1)z^{-1} + z^{-2}}{1 + P2(1+P1)z^{-1} + P1z^{-2}} \quad (1)$$

$$F1(P) = \frac{P(P+1)}{4-P} \cong 0.23P + 0.24P^2 \quad (3)$$

$$F2(P) = \frac{P(P-4)}{4+P^2} \cong -1.08P - 0.06P^2.$$

* * * * *